(12) United States Patent
Adhikesavalu et al.

(10) Patent No.: US 9,875,201 B2
(45) Date of Patent: Jan. 23, 2018

(54) AUTO-CONFIGURATION OF A PORT

(71) Applicant: DELL PRODUCTS L.P., Round Rock, TX (US)

(72) Inventors: Kapil Adhikesavalu, Arakkonam (IN); Shathish Muthu Venkatesan, Pulavar nagar Vellore (IN)

(73) Assignee: DELL PRODUCTS LP, Round Rock, TX (US)

( * ) Notice: Subject to any disclaimer, the term of this patent is extended or adjusted under 35 U.S.C. 154(b) by 507 days.

(21) Appl. No.: 14/307,352

(22) Filed: Jun. 17, 2014

(65) Prior Publication Data
US 2015/0363343 A1 Dec. 17, 2015

(51) Int. Cl.
*G06F 13/12* (2006.01)
*G06F 13/40* (2006.01)
*G01R 31/00* (2006.01)

(52) U.S. Cl.
CPC ......... *G06F 13/4004* (2013.01); *G01R 31/00* (2013.01)

(58) Field of Classification Search
CPC .................. G06F 13/4282; G06F 13/4068
USPC ........................................ 710/104
See application file for complete search history.

(56) References Cited

U.S. PATENT DOCUMENTS

| | | | | |
|---|---|---|---|---|
| 6,874,041 B1* | 3/2005 | Burd | ................. | H04Q 11/0421 709/227 |
| 7,356,433 B2* | 4/2008 | Tsai | ..................... | G01R 31/041 370/389 |
| 7,516,211 B1* | 4/2009 | Gourlay | .............. | H04L 41/0816 370/356 |
| 2006/0277324 A1* | 12/2006 | Aldereguia | ......... | G06F 13/4072 710/1 |
| 2007/0233431 A1* | 10/2007 | Steger | .................... | G01D 9/005 702/189 |

OTHER PUBLICATIONS

"SFF Committee, SFF-8436 Rev. 4.8, Specification for QSFP+ 10 Gbs 4X Pluggable Transceiver," Oct. 31, 2013 (87pgs).

* cited by examiner

*Primary Examiner* — Titus Wong
(74) *Attorney, Agent, or Firm* — North Weber & Baugh LLP (57) ABSTRACT

Embodiments of the present invention provide automatic provisioning of a port in an information handling system, such as a router, switch, bridge, etc., according to the cable type that is inserted into the port. In embodiments, if a user has inserted a break-out cable into a port that is not configured for break-out mode, the information handling system quickly and transparently changes the port configuration to a break-out mode. Conversely, when a user inserts a non-break-out cable that cannot be fanned out into a quad-mode port, the information handling system configures that port to native mode (i.e., non-break-out mode). In embodiments, the user may override auto-configuration. In embodiments, one or more port configurations may be stored and applied to a port by a user.

20 Claims, 6 Drawing Sheets

AUTO-CONFIGURATION OF A PORT

BACKGROUND

Field of Invention

The present invention relates generally to data communication and devices, and relates more particularly to configuration of a port or ports of a networking device.

Description of the Related Art

As information handling systems (such as switches and routers) evolve, faster speed ports are supported by most networking device vendors. For example, current high-speed ports, such as 40 G/100 G ports, are supported in many switches and routers; however, these devices should be able to support lower speed ports (for example, 10 G ports) for connecting to other devices.

One way to support lower speed downstream ports is to use a break-out cable. A break-out cable extends a single port into multiple lower speed ports. For example, a break-out cable may extend a single 40 G ports into four 10 G ports or extend one 100 G port into twelve, ten, or four 10 G ports (depending upon implementation).

One of the problems with a break-out cable is that the user has to provision the desired port in quad mode (if the port is in 40 G mode) and reload the device to make the cable operational. Conversely, if the user inserts a 40 G cable that cannot be fanned-out, she or he has to configure the port back from quad mode to normal mode.

This method of manual configuration is time consuming and is prone to errors, especially in devices that support a large number of high-speed ports. Also, having to reload the device to update the configuration is also time consuming and results in network downtime.

Furthermore, many network devices do not support a range command or commands that allow for the configuration of multiple ports at once. Thus, each port must be separately configured, which further adds to the potential for configuration errors and for time-consuming network administration.

Accordingly, what is needed are systems and methods that make the configuring of ports into a break-out mode or from a break-out mode back to a normal mode more simple and automatic.

BRIEF DESCRIPTION OF THE DRAWINGS

Reference will be made to embodiments of the invention, examples of which may be illustrated in the accompanying figures, in which like parts may be referred to by like or similar numerals. These figures are intended to be illustrative, not limiting. Although the invention is generally described in the context of these embodiments, it should be understood that it is not intended to limit the spirit and scope of the invention to these particular embodiments. These drawings shall in no way limit any changes in form and detail that may be made to the invention by one skilled in the art without departing from the spirit and scope of the invention.

DESCRIPTION OF THE PREFERRED EMBODIMENTS

In the following description, for purposes of explanation, specific examples and details are set forth in order to provide an understanding of the invention. It will be apparent, however, to one skilled in the art that the invention may be practiced without these details. Well-known process steps may not be described in detail in order to avoid unnecessarily obscuring the present invention. Other applications are possible, such that the following examples should not be taken as limiting. Furthermore, one skilled in the art will recognize that aspects of the present invention, described herein, may be implemented in a variety of ways, including software, hardware, firmware, or combinations thereof.

Components, or modules, shown in block diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components or modules.

Furthermore, connections between components within the figures are not intended to be limited to direct connections. Rather, data between these components may be modified, re-formatted, or otherwise changed by intermediary components (which may or may not be shown in the figure). Also, additional or fewer connections may be used. It shall also be noted that the terms "coupled" or "communicatively coupled" shall be understood to include direct connections, indirect connections through one or more intermediary devices, and wireless connections.

In the detailed description provided herein, references are made to the accompanying figures, which form a part of the description and in which are shown, by way of illustration, specific embodiments of the present invention. Although these embodiments are described in sufficient detail to enable one skilled in the art to practice the invention, it shall be understood that these examples are not limiting, such that other embodiments may be used, and changes may be made without departing from the spirit and scope of the invention.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, such phrases in various places in the specification are not necessarily all referring to the same embodiment or embodiments. It shall be noted that the use of the terms "set" and "group" in this patent document shall include any number of elements. Furthermore, it shall be noted that methods or algorithms steps may not be limited to the specific order set forth herein; rather, one skilled in the art shall recognize, in some embodiments, that more or fewer steps may be performed, that certain steps may optionally be performed, and that steps may be performed in different orders, including some steps being done concurrently.

The terms "packet" or "frame" shall be understood to mean a group of bits that can be transported across a network. The term "frame" shall not be interpreted as limiting embodiments of the present invention to Layer 2 networks; and, the term "packet" shall not be interpreted as limiting embodiments of the present invention to Layer 3 networks. The terms "packet," "frame," "data," or "data traffic" may be replaced by other terminologies referring to a group of bits, such as "datagram" or "cell."

It shall also be noted that although embodiments described herein may be within the context of network devices and fan-out or break-out cables, the invention elements of the current patent document are not so limited. Accordingly, the invention elements may be applied or adapted for use in other contexts.

1. Information Handling System Embodiments

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Aspects of the present patent document are directed to information handling systems. For purposes of this disclosure, an information handling system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
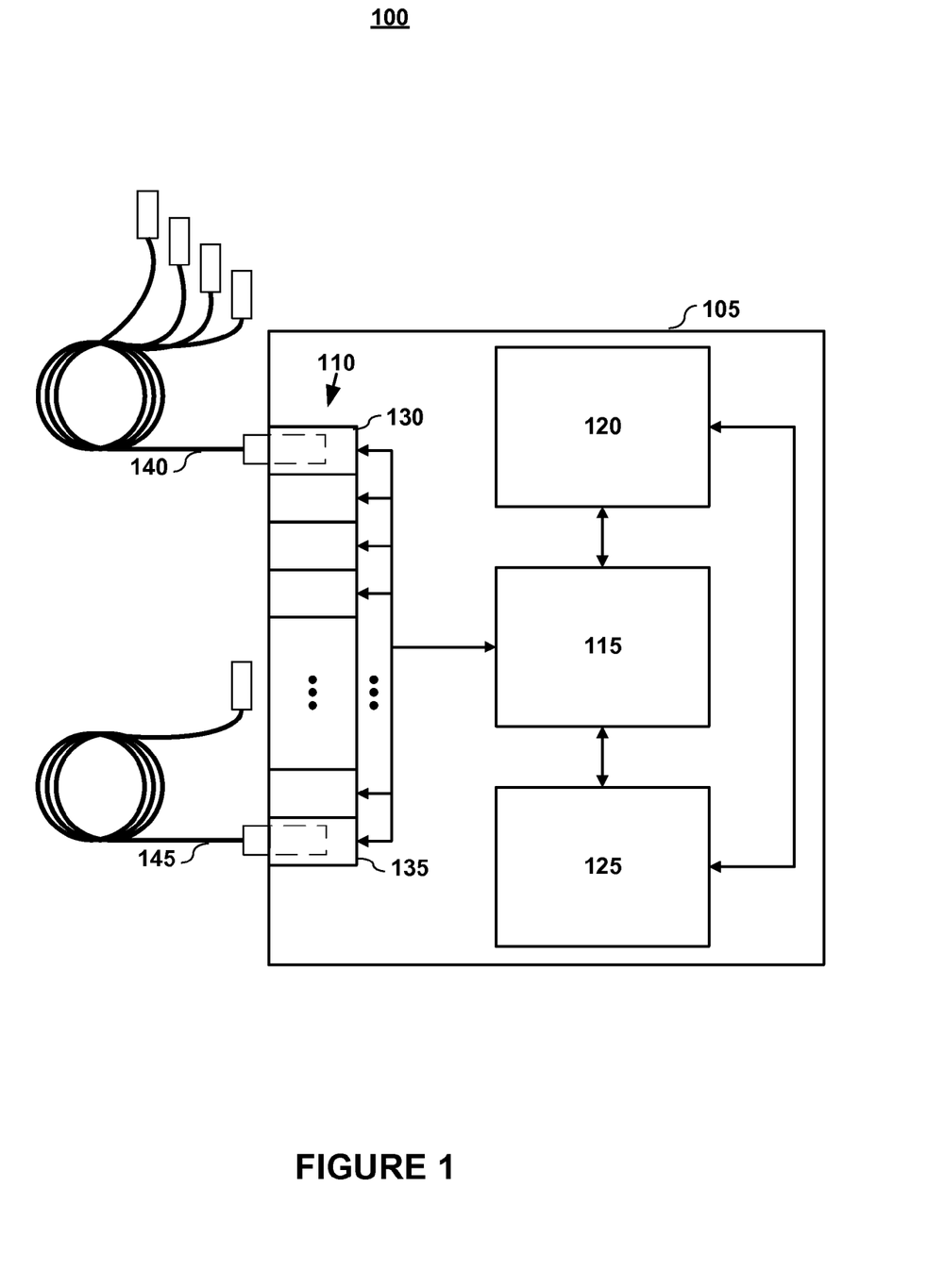
FIG. 1 depicts an exemplary information handling system according to embodiments of the present invention.

FIG. 1 depicts a simplified block diagram of an exemplary information handling system according to embodiments of the present invention. It will be understood that the functionalities shown for device 105 may operate to support various embodiments of an information handling system (or node)—although it shall be understood that a node may be differently configured and include different components. The information handling system 105 may include a plurality of I/O ports 110, a network processing unit (NPU) 115, one or more tables 120, and a central processing unit (CPU) 125.

In embodiments, the I/O ports 110 may be connected via one or more cables (e.g., break-out cable 140 and normal cable 145) to one or more other network devices or clients. The network processing unit (NPU) 115 may use information included in the network data received at the node 105, as well as information stored in the tables 120, to identify a next hop for the network data, among other possible activities. In embodiments, a switching fabric then schedules the network data for propagation through the node to an egress port for transmission to the next hop.

It shall be noted that aspects of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

2. Port Configurations Methodologies

As mentioned in the above, manual configuration of port is time consuming and can be prone to errors, especially in devices that support a large number of high-speed ports. Also, having to reload the device to update the configuration is also time consuming and problematic.

Embodiments of the present invention mitigate these problems by reading the type of cable that has been inserted into a port and by provisioning the port accordingly. In embodiments, the present invention may also exploit features in network processing units (NPU), such as using the "FlexPort" feature supported in Broadcom's BCM Trident II NPU sold by Broadcom of Irvine, Calif., that allow configuration updates without having to reset the NPU—thereby saving a reload cycle. Thus, in embodiments, a network device can be configured to automatically convert a high-speed port (e.g., 40 G/100 G port) into multiple 10 G ports, or vice versa, without NPU reset.

a. Break-Out Cable in a Normal Port

Figure 2:
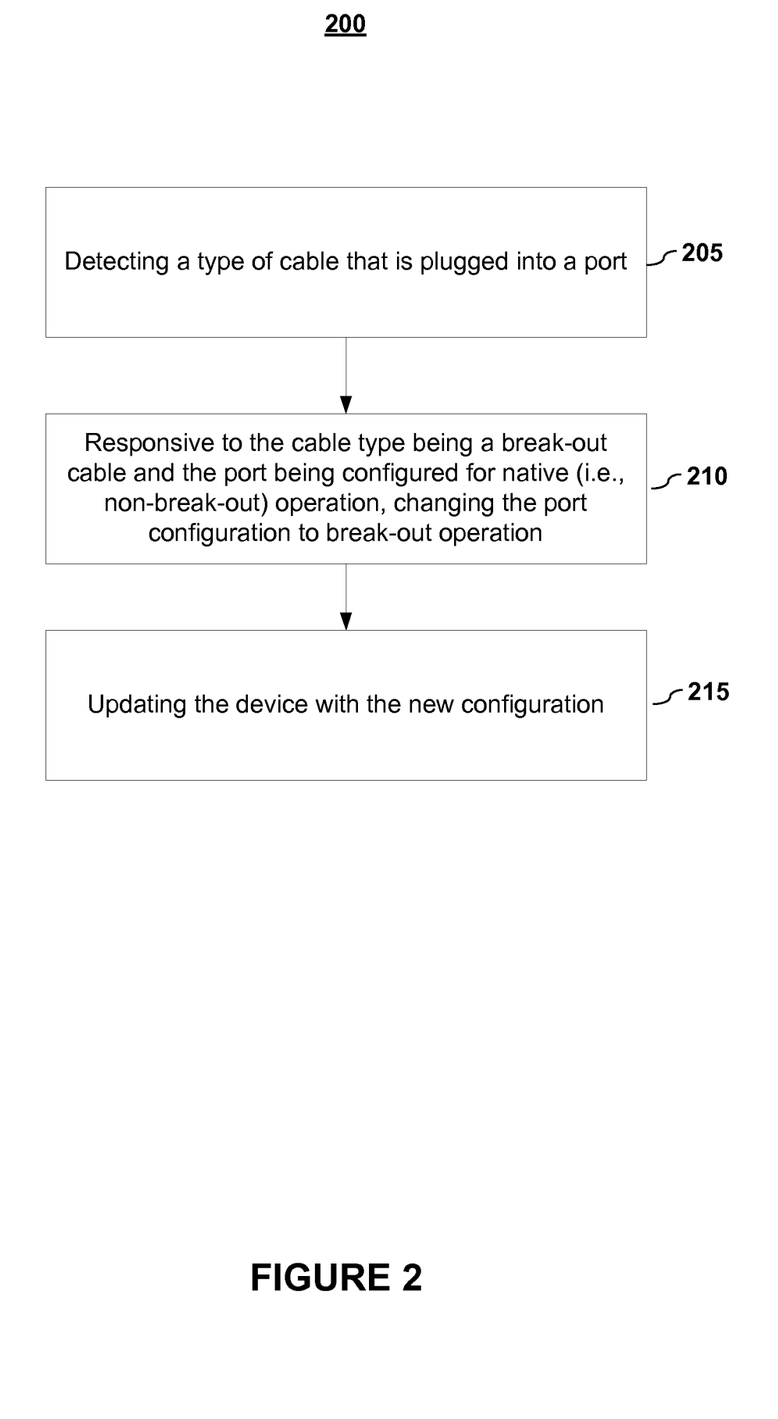
FIG. 2 depicts a method for configuration of a port according to embodiments of the present invention.

Turning now to FIG. 2, depicted is a method for configuring a port of an information handling system according to embodiments of the present invention. As shown in the depicted embodiment, a cable type of a cable that is plugged into a port in an information handling system may be detected (205). Thus, in embodiments, when the user inserts a cable, such as Quad (4-channel) Small Form-factor Pluggable (QSFP) cable, the information handling system identifies whether it is a break-out cable or normal cable by reading identifying data on the cable.

Figure 3:
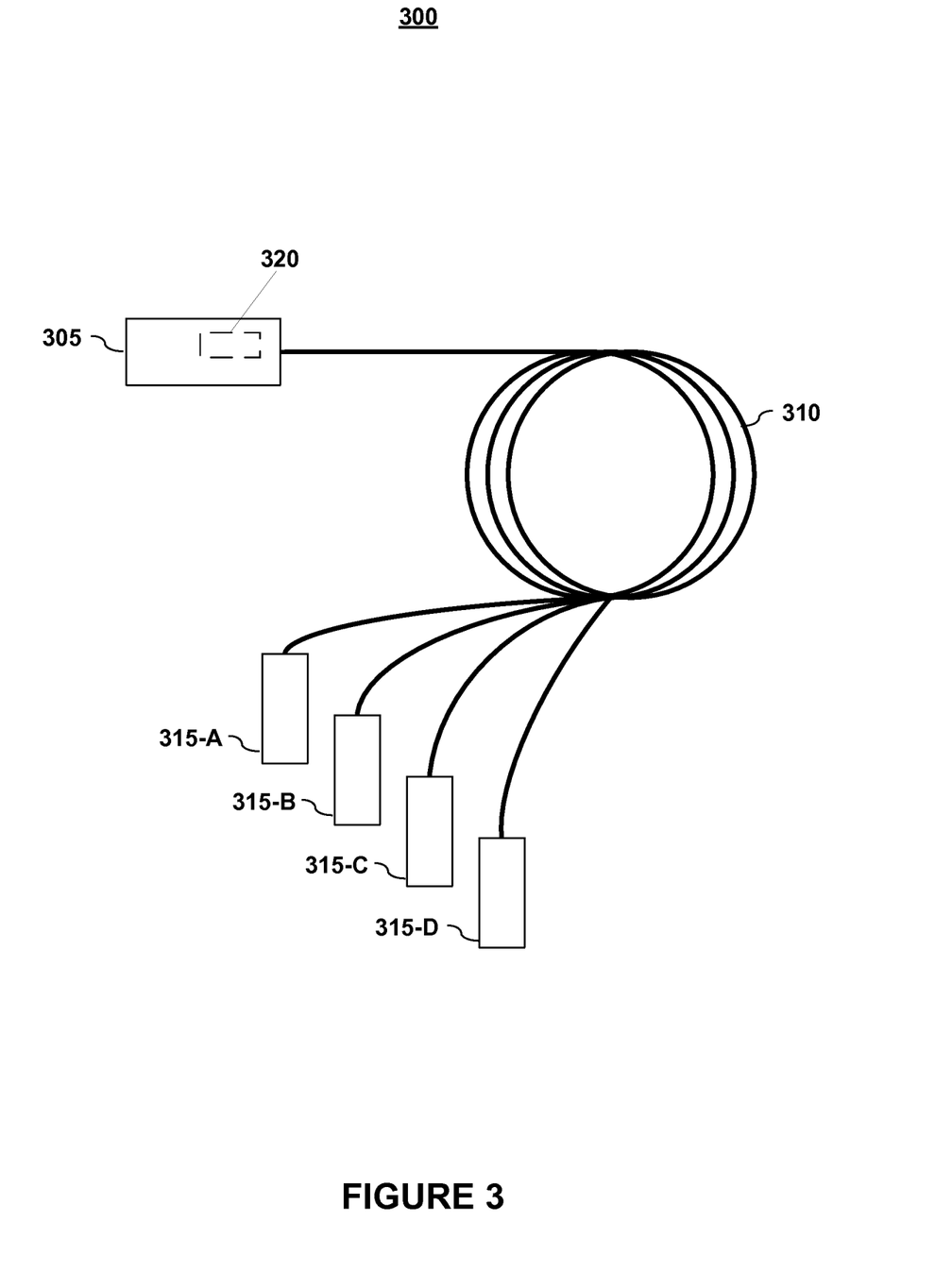
FIG. 3 depicts a break-out or fan-out cable according to embodiments of the present invention.

FIG. 3 graphically depicts an example of a break-out or fan-out cable 300 according to embodiments of the present invention. The cable 300 includes a QSFP connector 305 at one end for mating with a port and four corresponding connectors 315-A through 315-D on the other end for mating with ports. In embodiments, a connector of the cable (e.g., connector 305) includes an indicator, such as (by way of example and not limitation) data stored in a memory (e.g., memory 320) that identifies the cable time. For example, in embodiments, identifying whether it is a break-out cable or a normal cable may be achieved by reading the "optic type page 00 address 131" and "protocol field of F10ID" in the EEPROM of the QSFP. Thus, when the connector is inserted into a port, detection of the cable type can be achieved by the information handling system reading information programmed into the cable connector's EEPROM.

For example, as referenced in section 7.6.2.4, Table 33 in the "SFF-8436 Specification for QSFP+ 10 Gbs 4× Pluggable Transceiver" standard produced by the SFF Committee of the Electronic Industries Alliance (which document is incorporated by reference herein in its entirety), the cable may be of type CR4, LR4, or SR4:

An LR4 optic is used only in 40 G mode; thus, whenever the information handling system reads the optics type as LR4, the cable is detected as 40 G only cable.

A CR4 optic type (DAC—Direct Attachment Cable, where the optics and cable are integrated and cannot be split) can either be used in a 40 G cable or a 4×10 G cable; in this case, the information handling system reads the user configurable area in the EEPROM for detecting the optics type. For example, in case of Dell Force10 optics, the value from user configurable address (243-244) may be read. This content helps identify whether it is a 40 G cable or 4×10 G cable. In case a non-Dell qualified optic is inserted and if the information handling system is not able to interpret its type from the EEPROM, in embodiments, no action may be taken.

An SR4 optic may be used in 40 G or 4×10 G mode. Since the optic and the cable are separate, the user can join a normal fiber cable or a breakout fiber cable in this type of optic. It, therefore, may be impossible to say in which mode the user wishes to use this optic. Hence, in embodiments, no action may be taken in this case.

Returning to FIG. 2, having detected the type of cable (i.e., whether it is a normal cable or a break-out cable), the information handling system can compare the configuration of that port with that type of cable that is connected to the port. Thus, in embodiments, responsive to the cable type being a break-out cable and the port being configured for native (i.e., non-break-out) operation, the information handling system can change (210) the port configuration to a break-out operation mode.

In embodiments, it should be noted that an information handling system may be configured to have ports of a certain default configuration. For example, by default, all ports in the information handling system may be configured in native mode, that is, non-break-out mode. For example, the ports may be configured in native 40 G mode. It shall be noted that different default settings may be used or set, including having the break-out mode being set as default or having some combination of native mode ports and break-out mode ports.

Returning to FIG. 2, the information handling system has changed (210) the port's configuration to match the cable type that has been inserted into the port. But, in embodiments, for the configuration changes to take effect often the information handling system or portions thereof must first be reloaded. In embodiments, the reload operation may be performed automatically or set according to user-specified criterion or criteria.

Alternatively, in embodiments, the information handling system may take advantage of chipset features that allow for port configuration conversions without requiring a reload. By way of illustration and not limitation, as mentioned above, the present invention may also exploit features in a network processing unit (NPU), such as using the "Flex-Port" feature supported in Broadcom's BCM Trident II NPU sold by Broadcom of Irvine, Calif., that allows configuration updates without having to reset the NPU—thereby saving a reload cycle. Hence, embodiments of the present invention methodology of quad-mode provisioning is transparent, easy, and fast—the user just inserts a break-out cable into a port in order to use it. No other command line interface (CLI) configuration is needed.

b. Normal Cable in a Break-Out Configured Port

Figure 4:
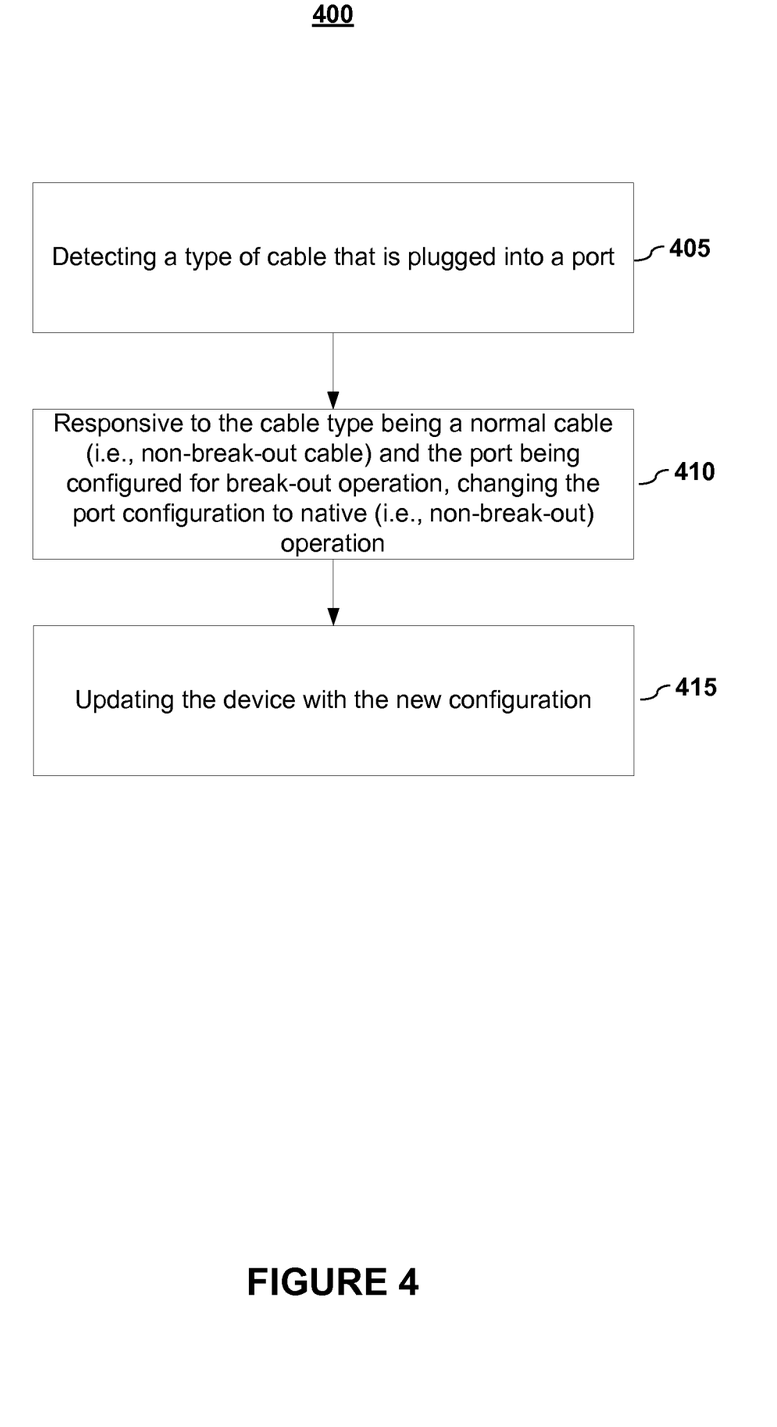
FIG. 4 depicts a method for configuration of a port according to embodiments of the present invention.

Turning now to FIG. 4, depicted is a method for configuring a port of an information handling system according to embodiments of the present invention. As shown in the depicted embodiment, a cable type that is plugged into a port in an information handling system may be detected (405). Thus, in embodiments, when the user inserts a cable, such as normal cable (for example, cable 145 in FIG. 1), the information handling system identifies whether it is a break-out cable or a normal cable by reading identifying data on the cable.

Having detected the type of cable as being a normal cable, the information handling system can compare the configuration of that port with the detected cable type. If the cable type and port configuration match, then, in embodiments, no action need be taken. However, in embodiments, responsive to the cable type and the current port configured not matching, the information handling system can change (410) the port configuration to a normal (i.e., non-break-out) operation mode.

Similarly as mentioned above with respect to FIG. 2, if the information handling system has changed (410) the port's configuration to match the cable type that has been inserted into the port, the system may be update the device with the new configuration so that it can take effect. In embodiments, the updating may involve exploiting chipset features or reloading the device.

c. General Methodology

Figure 5:
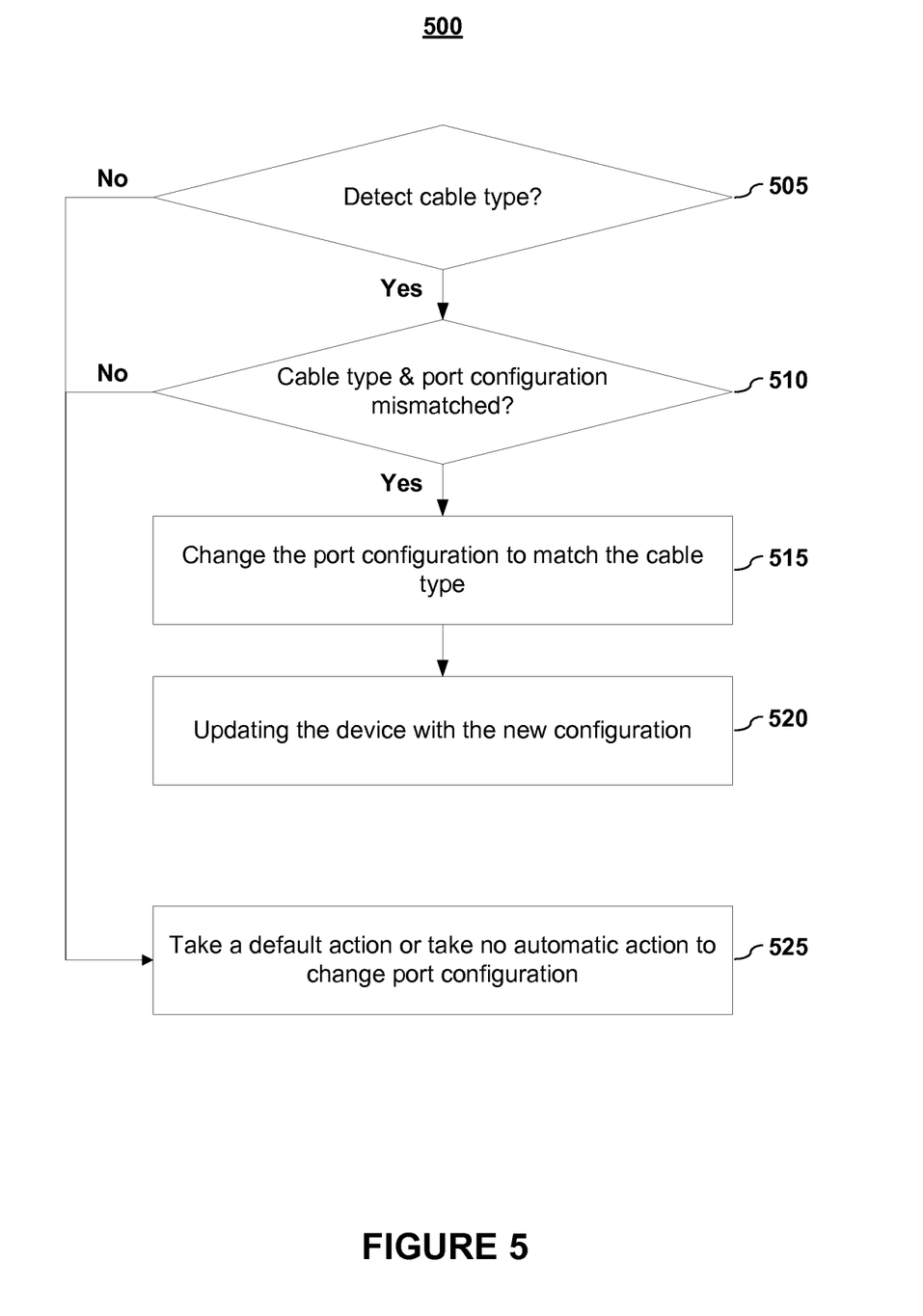
FIG. 5 depicts a method for configuration of a port according to embodiments of the present invention.

FIG. 5 depicts a general method for configuring one or more ports of an information handling system according to embodiments of the present invention. As shown in the depicted embodiment, an information handling system (IHS) attempts to detect (505) the cable type. In embodiments, the cable type may be stored in a memory (such as an EEPROM) of the cable.

Some cables may not include this information or there may be some error in the cable's memory. In such cases, the information handling system may take some default action (525), such as alert the administrator or configure the port with default settings. Alternatively, the information handling system may take no automatic action (525). For example, if the port is already configured, it may leave that configuration unchanged.

If the cable type is detected, the information handling system may compare the cable type with the configuration of the port in which the cable has been inserted. If the cable type and port configuration match, then no action need be taken (525). However, in embodiments, responsive to the cable type and the current port configured not matching, the information handling system can change (515) the port configuration to a mode that matches the cable type.

If the information handling system has changed (510) the port's configuration to match the cable type that has been inserted into the port, the system may update the device with the new configuration so that it can take effect. In embodiments, the updating may involve exploiting chipset features or reloading the device.

It should be noted that, in embodiments, if a user wishes to override this auto-configuration for any reason, she or he can do so through an interface (e.g., CLI or graphical user interface (GUI)). In embodiments, the ability to set the override may be done by device, by port, or by group of ports.

d. Port Configuration History/Versioning

There may be instances when a user inadvertently plugs in a break-out cable into a high speed (e.g., 40 G/100 G) port in normal mode or vice versa. If the information handling system is configured with the functionality of the present invention, this automatic configuration functionality may result in losing the configuration in that particular port, even though it is the correct configuration. If all the cables are recognized by the information handling system, the problem may be corrected by unplugging the wrong cable and plugging in the correct cable, thereby allowing the system to auto-configure to the correct plug. However, there may be instance, such as when a cable is not detected, where a prior configuration would like to be regained.

One way to mitigate such an issue is to have the information handling system alert the user that there is a cable type and port configuration mismatch. The alert could be a light, sound, display, message, or other type of alert, or combination thereof. Furthermore, the port configuration update may be delayed for some set amount of time to allow the user to react to the alert. Thus, if the cable is plugged in the wrong port and a user realizes it and removes the plug, no change to configuration is made.

Figure 6:
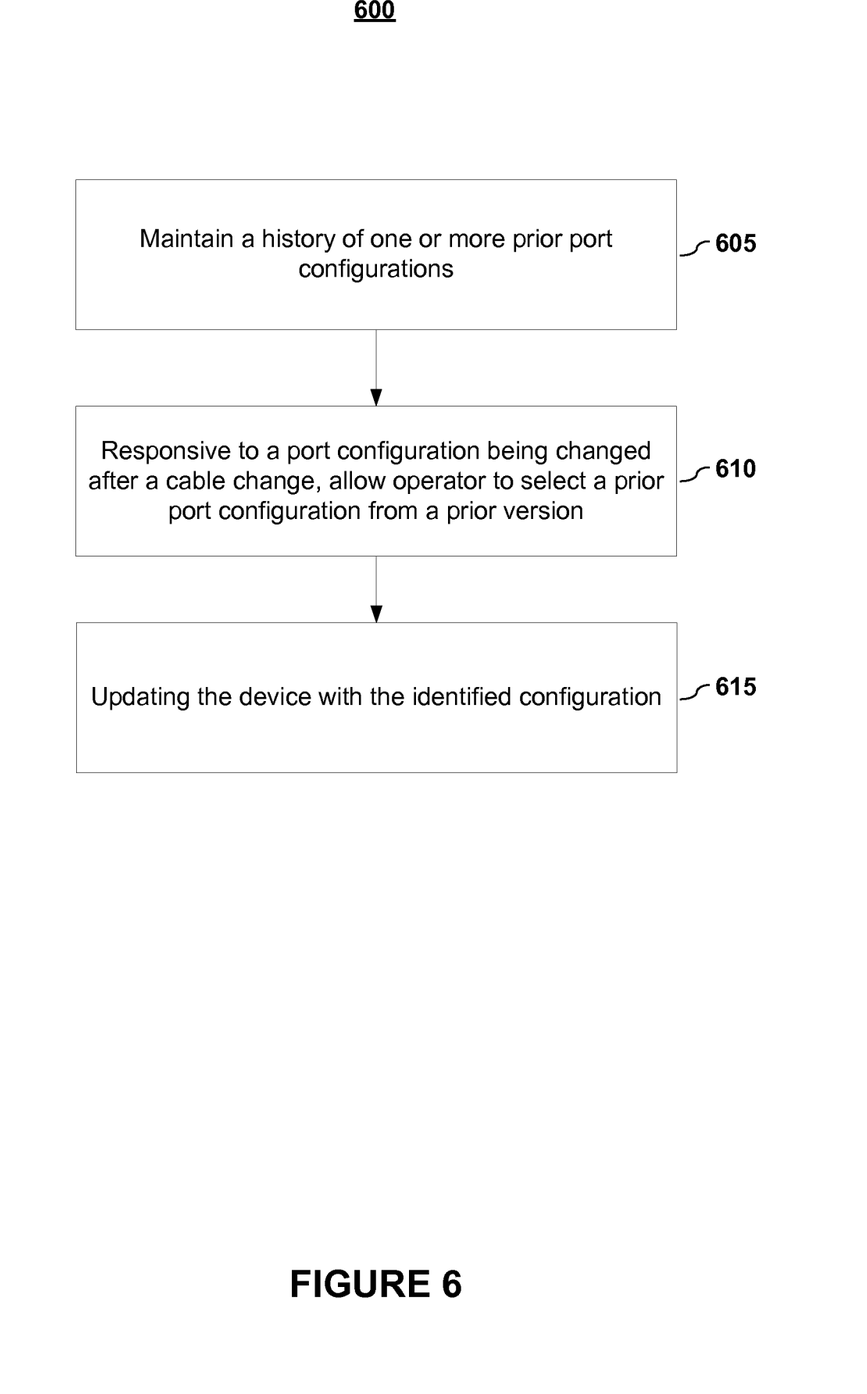
FIG. 6 depicts a method for maintaining history of port configurations for use in port configuration according to embodiments of the present invention.

Alternatively, or additionally, the information handling system may store or otherwise maintain (605) a history or versions of port configurations for each port, as shown in FIG. 6. In embodiments, a database may be maintained with all the interface level configurations stored therein. Thus, if a user inserts the wrong cable in a port and its configuration gets changed (610), an "undo config" feature may be used to undo the change. Additionally or alternatively, in embodiments, if the user accidently inserts a wrong cable and wishes to regain that port's configuration, she can insert the right cable back and issue "regain-port-config <port_no>" on EXEC mode to apply previously present configuration.

In embodiments, such features may only allow the user to go back to the last configuration. Additionally or alternatively, the system may support port configuration versions and the user may be able to specify a prior version from a plurality of prior versions.

Once the port version has been identified and entered, the device is updated (615) as discussed above.

It should be noted that, in embodiments, other factors (such as configuration changes when moving from old port mode to new port mode) may be handled in similar manner as how they are currently handled. Consider, by way of illustration, the following example. In a 40 G mode, a user has made an maximum transmission unit (mtu) configuration, with "no ip address" and "shutdown" being default configurations. The configuration settings may be as follows:

interface fortyGigE 1/52
no ip address
mtu 1000
shutdown

After configuring break-out mode in port 1/52 and updating the system, in 4×10 mode, the configurations are cleared from all the 10 G ports on break-out mode (i.e., the mtu configuration has been removed) and may be as follows:

interface TenGigabitEthernet 1/52
no ip address
shutdown
!
interface TenGigabitEthernet 1/53
no ip address
shutdown
!
interface TenGigabitEthernet 1/54
no ip address
shutdown
!
interface TenGigabitEthernet 1/55
no ip address
shutdown While the inventions have been described in conjunction with several specific embodiments, it is evident to those skilled in the art that many further alternatives, modifications, application, and variations will be apparent in light of the foregoing description. Thus, the inventions described herein are intended to embrace all such alternatives, modifications, applications and variations as may fall within the spirit and scope of the appended claims.

What is claimed is:

1. An information handling system (IHS) comprising:
a plurality of input/output (I/O) ports, at least one or more of the plurality of I/O ports being configured to receive a connector of a cable to facilitate connection with one or more network devices;
one or more processors that are communicatively coupled to the plurality of ports; and
a memory that is communicatively coupled to the one or more processors and stores one or more sequences of instructions, in which execution of the one or more sequences of instructions by one or more processors causes steps to be performed comprising:
detecting a type of a cable that is plugged into a port from the plurality of I/O ports;

responsive to the type of cable being a break-out cable and the port being configured for non-break-out operation, changing a configuration of the port to break-out operation; and implementing the configuration of the port.

2. The information handling system of claim 1 wherein the one or more processors read the cable type from a memory on the cable.

3. The information handling system of claim 2 wherein the one or more processors read the cable type from an Electrically Erasable Programmable Read-Only Memory (EEPROM).

4. The information handling system of claim 1 wherein the one or more processors perform the step of implementing the configuration of the port without rebooting the IHS.

5. The information handling system of claim 4 wherein the step of implementing the configuration of the port without rebooting the IHS comprises using an update feature of at least one processor from the one or more processors.

6. The information handling system of claim 1 wherein one or more prior port configurations are stored in a memory in the IHS.

7. The information handling system of claim 6 wherein a user can apply a port configuration from the one or more prior port configurations to the port.

8. A processor-implemented method for automatically configuring a mode of a port in a networking device, the method comprising:

detecting a type of cable that is plugged into a port of the networking device;

responsive to the type of cable and a break-out mode or non-breakout mode configuration of the port being mismatched relative to the detected type of cable, changing the configuration of the port to conform with the detected type of cable; and updating at least a portion of the networking device to implement the changed configuration.

9. The processor-implemented method of claim 8 wherein the step of updating at least a portion of the networking device to implement the changed configuration is performed without rebooting the networking device.

10. The processor-implemented method of claim 8 further comprising:

responsive to the detected type of cable and the configuration of the port not being mismatched, not changing the configuration of the port.

11. The processor-implemented method of claim 8 further comprising:

storing in a memory at least one prior configuration of the port; and enabling a user to apply to the port a prior configuration from the at least one prior configuration.

12. The processor-implemented method of claim 11 wherein the step of storing in a memory at least one prior configuration of the port comprising:

storing in a memory a plurality of prior port configurations of the port.

13. An information handling system (IHS) comprising:

a plurality of input/output (I/O) ports, at least one or more of the plurality of I/O ports being configured to receive a connector of a cable to facilitate connection with one or more network devices;

one or more processors that are communicatively coupled to the plurality of ports; and a memory that is communicatively coupled to the one or more processors and stores one or more sequences of instructions, in which execution of the one or more sequences of instructions by one or more processors causes steps to be performed comprising:

detecting a type of cable that is plugged into a port from the plurality of I/O ports;

responsive to the cable type and a port configuration being mismatched relative to a break-out or a non-break operation of the port, changing the configuration of the port to conform with break-out or non-break-out cable type; and updating the IHS with the changed configuration of the port.

14. The information handling system of claim 13 wherein the one or more processors read the cable type from a memory on the cable.

15. The information handling system of claim 13 wherein the one or more processors perform the step of implementing the configuration of the port without rebooting the IHS.

16. The information handling system of claim 15 wherein the step of implementing the configuration of the port without rebooting the IHS comprises using an update feature of at least one processor from the one or more processors.

17. The information handling system of claim 13 wherein the memory further comprises one or more sequences of instructions that, when executed by one or more processors causes steps to be performed comprising:

responsive to the cable type and a port configuration not being mismatched relative to a break-out or a non-break operation of the port, not changing the configuration of the port.

18. The information handling system of claim 13 wherein the memory further comprises one or more sequences of instructions that, when executed by one or more processors causes steps to be performed comprising:

responsive to the cable type not being detected, not automatically changing the configuration of the port.

19. The information handling system of claim 13 wherein one or more prior port configurations are stored in a memory in the IHS and a user can apply a prior port configuration from the one or more prior port configurations to the port.

20. The information handling system of claim 13 wherein an alert is provided to user after detecting a mismatch but before changing the configuration of the port.

* * * * *